March 7, 1972 I. LADANY 3,647,579

LIQUID PHASE DOUBLE EPITAXIAL PROCESS FOR MANUFACTURING LIGHT EMITTING GALLIUM PHOSPHIDE DEVICES

Filed March 28, 1968

INVENTOR
IVAN LADANY

BY [signature]

ATTORNEY

United States Patent Office 3,647,579
Patented Mar. 7, 1972

3,647,579

LIQUID PHASE DOUBLE EPITAXIAL PROCESS FOR MANUFACTURING LIGHT EMITTING GALLIUM PHOSPHIDE DEVICES

Ivan Ladany, Skillman, N.J., assignor to RCA Corporation

Filed Mar. 28, 1968, Ser. No. 716,970
Int. Cl. H05b *33/00;* H01l *3/00, 7/38*
U.S. Cl. 148—171 9 Claims

ABSTRACT OF THE DISCLOSURE

Gallium phosphide light emitting diodes with reproducible external quantum efficiencies greater than 1% are manufactured by successive liquid phase epitaxial growth of N type and P type layers on a gallium phosphide substrate which may be of either conductivity type.

The N type layer is grown first from a melt of tellurium and gallium phosphide in a gallium solvent. The P type layer is subsequently grown on the N type layer from a melt of zinc oxide, gallium oxide and gallium phosphide in a gallium solvent.

BACKGROUND OF THE INVENTION

This invention relates to the manufacture of light emitting semiconductor devices, and more particularly to a process for manufacturing a gallium phosphide device capable of emitting visible light in response to an applied electrical control signal.

The wide band gap of gallium phosphide makes it desirable for fabrication of devices capable of emitting visible light. Such devices are well known in the art, and generally take the form of a body of monocrystalline gallium phosphide having adjacent P type and N type regions with a P-N junction therebetween.

It has been found that the external quantum efficiency of such devices, when employed to generate visible light as a result of carrier recombination initiated by current flowing across the P-N junction in the forward bias direction, is relatively low, typical values being on the order of a few tenths of 1%.

In order to optimize the external quantum efficiency of gallium phosphide P-N junction devices, it is preferred (i) to employ doping impurities which provide a relatively efficient optical transition between the energy levels introduced by the impurities, and (ii) for the light generated in the vicinity of the P-N junction to emerge from the device with minimal attenuation.

The use of tellurium as the donor impurity for the N type gallium phosphide region has been found to be desirable in order to achieve the preferred features outlined above. Similarly, the use of zinc and oxygen as a composite acceptor impurity for the gallium phosphide P type region has been found to yield an optical transition, in conjunction with the tellurium doped N type region, of relatively good efficiency. Various investigations have endeavored to provide gallium phosphide semiconductor devices having a zinc-oxygen doped P type region and an overlying tellurium dope N type region, with a P-N junction therebetween.

One of the major problems experienced by such prior art researchers in fabricating such devices has been that of providing a suitable substrate. Substrates have been grown, e.g., by slow cooling in a Bridgman or vertical furnace, as described in an article by L. M. Foster, T. S. Plaskett and J. E. Scardefield, published in the IBM Journal of Research and Development, vol. 10, p. 114, 1966. This technique, however, produces a large number of substrate platelets of different (statistically distributed) sizes and qualities, only a small percentage of which are of acceptable quality. Therefore, this process is suitable for laboratory use only, and cannot be used for economic fabrication of gallium phosphide substrates on a mass production basis.

Another technique for manufacturing gallium phosphide substrates is the so-called close spaced vapor transport method, described in an article by F. H. Nicoll, published in the Journal of the Electrochemical Society, vol. 110, No. 11, p. 1165, November 1963. While this method yields gallium phosphide of good quality, difficulties are encountered in introducing the desired quantity of doping impurity material.

One approach to the manufacture of a gallium phosphide light-emitting diode having the aforementioned doping impurities is the liquid phase epitaxial growth of a tellurium doped N type layer on a zinc-oxygen doped P type substrate. However, the best external quantum efficiency reproducibly obtainable at room temperature by this technique has been on the order of 0.3–0.5%. See, e.g., the article by M. R. Lorenz and M. Pilkuhn, entitled "Preparation and Properties of Solution-Grown Epitaxial P-N Junctions in GaP," published in the Journal of Applied Physics, vol. 37, No. 11, October 1966.

An effort has also been made to fabricate gallium phosphide diodes with the aforementioned doping impurities by liquid phase epitaxial growth of a P type layer on a substrate, followed by liquid phase epitaxial growth of an N type layer on the P type epitaxial layer. In this case, growth of the P type layer has been carried out in the presence of a carbon monoxide atmosphere in an effort to supply additional oxygen to obtain the desired zinc-oxygen doping. Efficiencies on the order of 0.2–0.4% have been reproducibly obtained with this approach. See, e.g., the article by F. A. Trumbore, M. Kowalchik and H. G. White, entitled "Efficient Electroluminescence in GaP P-N Junctions Grown by Liquid-Phase Epitaxy on Vapor-Grown Substrates," published in the Journal of Applied Physics, vol. 38, No. 4, March 1967.

Accordingly, an object of the present invention is to provide a gallium phosphide semiconductor device having a tellurium doped N type region and a zinc-oxygen doped P type region, and exhibiting an external quantum efficiency which is reproducible and substantially greater than that of similar devices heretofore known.

Another object is to provide such a device without the necessity of fabricating a substrate of very high quality.

SUMMARY

A first melt is prepared which comprises gallium phosphide and tellurium in a gallium solvent. This first melt is applied to a surface of a gallium phosphide substrate and allowed to cool to form an N type gallium phosphide epitaxial layer on the substrate surface.

A second melt is prepared which comprises gallium phosphide and zinc oxide in a gallium solvent. The exposed surface of the N type epitaxial layer is immersed in the second melt, which cools to form a P type gallium phosphide epitaxial layer on the N type layer. The boundary between the P type and N type layers defines a light emitting P-N junction.

DETAILED DESCRIPTION

The manufacture of a gallium phosphide diode according to the preferred embodiment of the invention is accomplished by successively growing N type and P type epitaxial layers on a suitable substrate. The substrate may comprise monocrystalline gallium phosphide of either type conductivity. The substrate employed may be grown by vapor or close spaced transport methods, or formed as a platelet in a Bridgman or vertical furnace by the method previously referred to. The particular method by which the substrate is provided is not critical so long as the substrate has a surface of acceptable crystalline quality and is relatively free of fast-diffusing nonradiative impurities.

Figure 1:
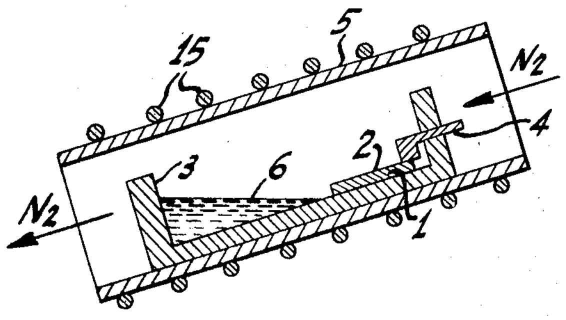
FIG. 1 shows apparatus useful for practicing the process according to a preferred embodiment of the invention.

To commence the epitaxial growth process, as shown in FIG. 1, a suitable substrate 1 which may comprise a mono-crystalline zinc doped P type gallium phosphide wafer having a substantially planar major surface 2 of at least fair crystalline quality, is positioned in a vitreous carbon-lined boat 3 and at one end of the boat by means of a clamp 4.

The boat 3 is maintained within a furnace 5 in an inclined position, as shown in the drawing. The wafer 1 is positioned at the upper end of the boat 3, and a melt 6 is contained at the lower end of the boat. The furnace 5 is heated by means of resistance wires 15 which are coupled to a suitable source of electrical energy (not shown). In order to preclude undesirable side reactions during the epitaxial deposition process, an inert atmosphere comprising a gas such as nitrogen is passed over the boat 3.

The melt 6 may be prepared, e.g., by mixing together 0.3 gram of polycrystalline gallium phosphide, 0.2 milligram of tellurium and 3 grams of gallium. Other quantities of these ingredients may be employed so long as the same relative proportions are maintained. This mixture is heated to a temperature on the order of 1060° C., so that the gallium phosphide and tellurium dissolve in the gallium, which acts as a solvent for the other ingredients.

After the melt 6 has been heated to 1060° C., the furnace 5 (and consequently the boat 3) is tipped so that the major surface 2 of the substrate 1 becomes immersed in the melt 6. The melt 6 is then cooled at a rate of approximately 20° C. per minute until the temperature reaches 950° C. At this time the cooling rate decreases to approximately 10° C. per minute, and is maintained at a value on this order until the temperature reaches 700° C.

During this cooling process, the gallium phosphide and tellurium precipitate from the melt 6 to form a tellurium doped monocrystalline gallium phosphide epitaxial layer 7 (see FIG. 2) on the surface 2 of the substrate 1. By the time the temperature reaches 700° C., precipitation of the epitaxial layer, which is N type, has been substantially completed, the resultant layer 7 having a thickness on the order of 1 to 2 mils.

When the furnace temperature reaches 700° C., the furnace is shut down and allowed to cool to 400° C. This cooling process takes approximately 1 hour.

The substrate 1, having the N type epitaxial layer 7 thereon, is then removed from the furance 5. The gallium solvent overlies the epitaxial N type layer 7. The epitaxial layer is also usually covered by a number of tellurium dendrites which are precipitated from solution during the cooling process.

The gallium is removed from the epitaxial layer 7 by immersing the substrate in boiling concentrated hydrochloric acid. Any tellurium dendrites then present are subsequently removed by immersing the substrate 1 in a boiling mixture of nitric and hydrochloric acids.

In preparation for the deposition of a P type epitaxial layer 8 on the N type epitaxial layer 7, a suitable homogeneous melt is prepared. This melt contains zinc and oxygen in accurately controlled relative proportions.

The zinc-oxygen doped melt is initially prepared by mixing together 0.3 gram gallium phosphide, 9 milligrams monocrystalline zinc oxide (usually in the form of one or two monocrystalline pellets), and 3 grams of gallium. This mixture is heated to 1100° C. over an approximate 40 minute period. The furnace is then shut down and the melt allowed to cool and solidify at room temperature. To the resulting solid mass there is then added 7 milligrams of monocrystalline zinc oxide and 3 milligrams of gallium oxide. The resulting mixture is then heated to 1060° C. to provide the desired conditioned homogeneous melt.

The reason for the aforementioned processing is to insure that the melt is homogeneous and contains the desired relative proportions of zinc and oxygen. Monocrystalline zinc oxide is highly effective as a zinc-oxygen source since it dissolves rapidly in the melt, thus minimizng loss of zinc and oxygen through evaporation. The zinc oxide also provides an accurately controlled ratio of zinc to oxygen in the melt.

Some loss of zinc and oxygen nevertheless occurs during the melting process, and since the oxygen loss occurs at a slightly greater rate than the zinc loss, it is desirable to adjust the proportions of the melt by adding a small quantity of oxygen after the melt has cooled to room temperature. This is accomplished, as described above, by adding a small quantity of gallium oxide to the initial melt as well as sufficient zinc oxide to compensate for evaporation losses during the initial melting process.

The resultant homogeneous and conditioned melt, having been heated to 1060° C., is then applied to the N type epitaxial layer 7 by tipping the furnace 5 in the manner previously described so that the exposed surface of the expitaxial layer 7 is immersed in the melt.

The zinc-oxygen doped melt is then cooled at approximately 20° C. per minute until a temperature of about 950° C. is reached. At this point, the cooling rate is reduced to approximately 10° C. per minute, and maintained at a value on this order until the temperature reaches a value on the order of 700° C. At this point, the gallium phosphide, zinc and oxygen have precipitated from the melt to form the P type zinc-oxygen doped epitaxial layer 8 (see FIG. 2) having a thickness on the order of 1 to 2 mils. The composite thickness of the N type layer 7 and the P type layer 8 is typically on the order of 3 to 4 mils.

After the furnace temperature reaches 700° C., the furnace is shut off and allowed to cool to approximately 400° C.

The substrate 1 is then removed from the furnace 4 for further processing.

Figure 2:
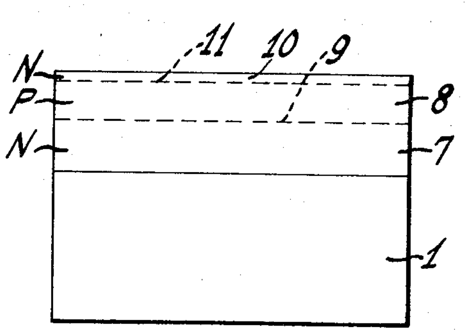
FIG. 2 shows a gallium phosphide wafer processed according to the preferred embodiment of the invention, at an intermediate stage of manufacture.

At this stage in the manufacturing process, the epitaxially coated substrate 1 is as shown in FIG. 2. The zinc-oxygen impurity doping concentration in the P type epitaxial layer 8 is relatively light, having a value on the order of $10^{17}/cm.^3$ in the vicinity of a P–N junction 9 at the interface between the epitaxial layers 7 and 8.

The impurity concentration within the epitaxial layer 8 decreases with distance away from the junction 9, until the acceptor impurity concentration drops to a value below that of the residual donor impurities present in the semiconductor material. At this point, the conductivity type of the epitaxial layer 8 has been discovered to revert to N type, so that a thin N type surface region 10 is formed at the outer surface of the P type epitaxial layer 8.

When the epitaxial layer 8 is grown according to the process described above, the N type "inversion" surface layer 10 has a thickness on the order of 0.1 to 0.2 mil. The resulting P–N junction 11 at the interface between the P type epitaxial layer 8 and the N type "inversion" surface region 10 has been found to be a non-radiative one. That is, application of a forward bias to the junction 11 does not result in emission of light from the junction region.

Accordingly, the surface region 10 is an undesirable result of the epitaxial growth process used, and must be removed. Removal of the region 10 is effected by lapping the surface of the epitaxial layer 8 to remove approximately 0.2 mil of semi-conductor material.

The order in which the epitaxial layers are deposited is important, it being desirable to deposit the N type epitaxial layer 7 first, and thereafter the overlying P type epitaxial layer 8. If the P type epitaxial layer 8 were deposited first, the associated "inversion" region 10 would appear in the immediate vicinity of the P–N junction formed when the N type epitaxial layer 7 is subsequently deposited on the P type epitaxial layer 8. The presence of this "inversion" region 10 in the immediate vicinity of the P–N junction would result in a considerable reduction in external quantum efficiency.

The semiconductor wafer is then cleaved in two parts along a crystallographic plane, and the cleaved surfaces are etched in aqua regia in order to delineate the P–N junction 9. Utilizing the delineated P–N junction as a reference, the substrate 1 is completely removed from each wafer part by lapping.

Figure 4:
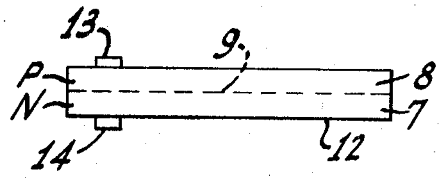

The resulting semiconductor slices, comprising only the contiguous epitaxial layers 7 and 8, are then cleaved along directions parallel to their crystallographic axes to provide a number of individual rhombohedral dice 12, as shown in plan view of FIG. 4. Each of the rhombohedral dice 12 has a maximum diagonal dimension which may typically be on the order of 20 mils. Dice 12 manufactured by the method described have reproducibility exhibited an external quantum efficiency consistently in excess of 1%.

This efficiency is obtained without the use of index (of refraction) matching or antireflective coatings on the die. Devices fabricated according to the above-described process exhibit substantially no light absorption within the bulk semi-conductor material. It is believed that this lack of internal absorption is due to the fact that the impurity doping level is in the vicinity of the P–N junction and decreases with distance away from the junction.

Rather than being rhombohedral, each die 12 may be triangular or trapezoidal. Each die 12 has a total thickness on the order of 3 to 4 mils.

The next step in the manufacturing process is the provision of electrodes to the epitaxial layers 7 and 8.

Each die 12 is first etched in aqua regia to prepare the major surfaces thereof for the electrodes and to reduce leakage across the P–N junction 9. An electrode 13 is provided by allowing a small dot, comprising 99% gold-1% zinc composition, to a corner region of the exposed surface of the P type layer 8 of the die 12. The gold-zinc dot is alloyed to the P type region 8 at a temperature on the order of 800° C. for a time on the order of 2 seconds.

Similarly, an electrode to the exposed surface of the N type region 7 of the die 12 is provided by alloying a small dot comprising tin to one corner of the exposed surface of the N type epitaxial layer 7, at a position opposite that of the electrode 13, as shown in FIG. 4. As before, this alloying step is carried out at a temperature on the order of 800° C. for a time on the order of 2 seconds.

Wires or printed circuit leads may then be soldered to the electrodes 13 and 14 by means of an indium or tin solder.

Figure 3:
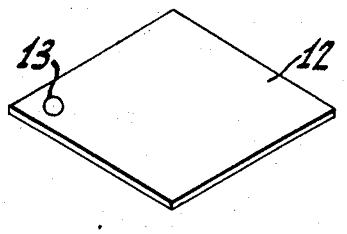
FIGS. 3 and 4 show a portion of the gallium phosphide wafer at a later stage of manufacture.
Figure 5:
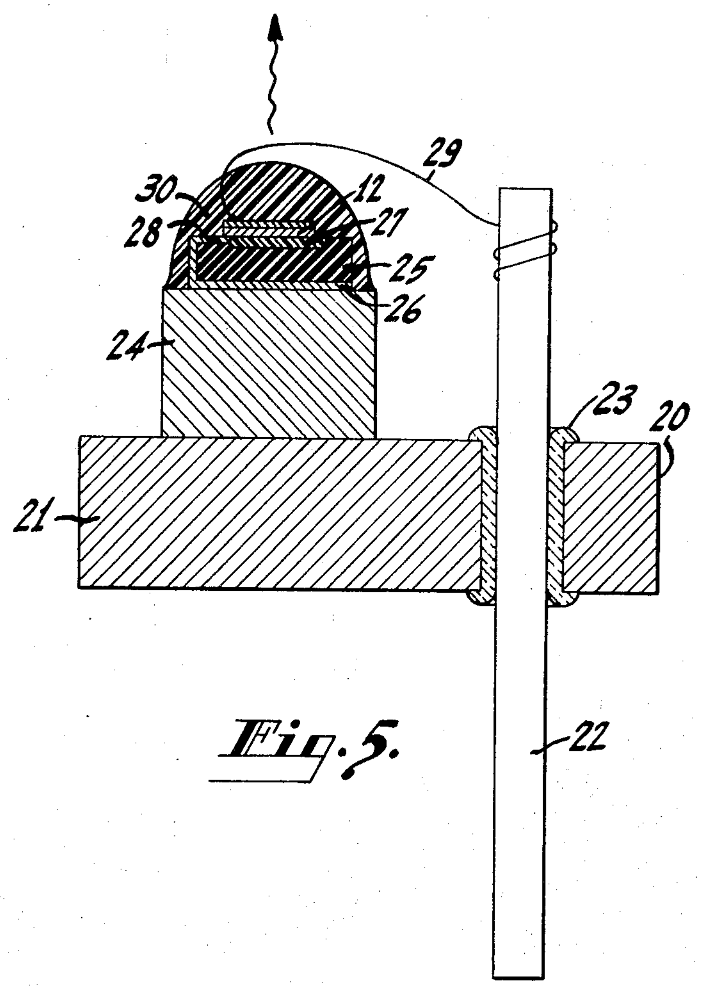
FIG. 5 shows a complete light emitting semiconductor device incorporating the semiconductor element shown in FIGS. 3 and 4.

The resulting semiconductor element, shown in FIGS. 3 and 4, may then be assembled to a suitable package to provide a complete light-emitting semiconductor device 20, as shown in FIG. 5.

The semiconductor device 20 comprises a thermally and electrically conductive Kovar header 21 having a Kovar terminal lead 22 extending therethrough. The terminal lead 22 is electrically insulated from the header 21 by means of a glass seal 23. Mounted on the header 21 is a thermally and electrically conductive molybdenum terminal block 24.

Disposed on the upper surface of the terminal block 24 is an alumina disk 25, the lower surface of which is coated with a metallic layer 26 which is soldered to the molybdenum block 24. The upper surface of the alumina disk 25 has a recess 27, such that the bottom of the recess 27 is smooth and exhibits good light reflectivity. The portion of the ceramic disk 25 adjacent an edge of the recess 27 is coated with a metallic layer 28 which extends around the side of the disk 25 to provide electrical continuity to the header 21 via the metallic layer 26 and molybdenum terminal block 24.

The semiconductor element 12 is disposed over the recess 27. The electrode 14 of the N type epitaxial layer 7 is soldered to the metallic layer 28 at an edge of the recess 27, so that the semiconductor element 12 extends over the recess 27 in cantilever fashion. There is thus provided an electrical connection between the N type epitaxial layer 7 and the header 21.

An electrical connection between the terminal lead 22 and the electrode 13 of the P type epitaxial layer 8 is provided by means of a wire 29, one end of which is soldered to the electrode 13, the other end of the wire being wrapped around and soldered to the end of the terminal lead 22.

A transparent plastic medium 30 encapsulates and provides mechanical support for the semiconductor element 12. The plastic 30 has an index of refraction between that of gallium phosphide and that of air, and so serves to provide efficient optical coupling between the semiconductor element 12 and the surrounding atmosphere.

In operation, the semiconductor device 20 emits visible light upon application of a suitable voltage between the header 21 and terminal lead 22, the terminal lead 22 being positive with respect to the header 21. The light is generated in the immediate vicinity of the P-N junction 9 and radiates outwardly from both major surfaces of the semiconductor element 12.

The gallium phosphide material is relatively transparent to the radiated light. Light which leaves the exposed surface of the (lower) N type epitaxial layer 7 is reflected from the bottom of the recess 27 to re-enter the semiconductor element 12 and emerge in a direction parallel to that of light radiated from the (upper) exposed surface of the P type epitaxial layer 8. This arrangement serves to effectively double the light output of the device 20.

What is claimed is:

1. A process for manufacturing a light-emitting semiconductor device, comprising the steps of:

providing a substantially monocrystalline gallium phosphide substrate having a surface;

preparing a first melt comprising gallium phosphide and tellurium in a gallium solvent;

immersing said surface in said first melt;

cooling said first melt to form on said surface an N type gallium phosphide epitaxial layer;

removing any residual gallium and any tellurium dendrites from the exposed surface of said N type layer;

preparing a substantially homogeneous second melt comprising gallium phosphide and zinc oxide in a gallium solvent;

immersing the exposed surface of said N type epitaxial layer in said second melt; and cooling said second melt at an initial rate of at least 20° C. per minute to form on said exposed surface a P type gallium phosphide epitaxial layer, the boundary between said epitaxial layers defining a light emitting P-N junction.

2. A process according to claim 1, wherein said zinc oxide is initially introduced into said second melt in the form of at least one substantially monocrystalline mass.

3. A process according to claim 1, wherein said immersing and cooling steps are carried out in an inert atmosphere.

4. A process according to claim 1, wherein said second melt includes gallium oxide.

5. A process according to claim 1, wherein the relative proportions, by weight, of gallium phosphide, tellurium and gallium in said first melt are 0.3:0.0002:3, respectively.

6. A process according to claim 4, wherein said second melt preparing step comprises:

preparing a mixture comprising gallium phosphide, zinc oxide and gallium in the respective relative proportions of 0.3:0.009:3, by weight;

heating said mixture to a temperature on the order of 1100° C. to convert the mixture to a molten mass;

allowing the molten mass to cool;

adding to the cooled molten mass zinc oxide and gallium oxide in the relative proportions of 0.007 and 0.003 respectively to form a new mixture; and heating said new mixture to a temperature on the order of 1060° C.

7. A process according to claim 5, wherein (a) said major surface is immersed in said first melt at a temperature on the order of 1060° C., and (b) said first melt is cooled to a temperature of approximately 950° C. at a rate on the order of 20° C. per minute, and to a temperature below approximately 700° C. at a rate on the order of 10° C. per minute.

8. A process according to claim 6, wherein (a) said exposed surface is immersed in said second melt at a temperature on the order of 1060° C., and (b) said second melt is cooled to a temperature of approximately 950° C. at a rate on the order of 20° C. per minute, and to a temperature below approximately 700° C. at a rate on the order of 10° C. per minute.

9. A process according to claim 1, wherein during said second melt cooling step an N type inversion layer is formed in the last-formed part of said P type layer, comprising the additional step of removing said inversion layer to expose said P type layer.

References Cited

UNITED STATES PATENTS

| | | | |
|---|---|---|---|
| 3,278,342 | 10/1966 | John et al. | 148—1.6 |
| 3,427,211 | 2/1969 | Foster et al. | 148—171 |
| 3,462,320 | 8/1969 | Lynch et al. | 148—171 |
| 3,470,038 | 9/1969 | Logan et al. | 148—171 |

OTHER REFERENCES

Trumbore et al.: "Efficient Electroluminescence in GaP p-n Junctions etc." J. Appl. Phys., vol. 38, No. 4, pp. 1987–8 (Mar. 15, 1967).

Starkiewicz et al.: "Injection Electroluminescence at p-n Junctions in Zinc Doped Gallium Phosphide," J. Phys. Chem. Solids, vol. 23, pp. 881–884 (1962).

Nelson, H.: "Epitaxial Growth From the Liquid State and Its Application to the Fabrication of Tunnel and Laser Diodes," R.C.A. Review, December 1963, pp. 603–615.

Lorenz et al.: "Preparation and Properties of Solution-Grown Epitaxial p-n Junctions in GaP," J. Appl. Phys., vol. 37, No. 11, pp. 4094–4102 (October 1966).

L. DEWAYNE RUTLEDGE, Primary Examiner

W. G. SABA, Assistant Examiner

U.S. Cl. X.R.

23—301; 117—201; 148—1.5, 172, 173; 252—62.3; 317—235 N